United States Patent

Shinohara et al.

Patent Number: 5,612,144
Date of Patent: Mar. 18, 1997

[54] ELECTRIFICATION REMOVING COMPONENT

[75] Inventors: Nobuhiro Shinohara; Otojiro Kida, both of Yokohama, Japan

[73] Assignee: Asahi Glass Company Ltd., Tokyo, Japan

[21] Appl. No.: 107,316

[22] Filed: Aug. 17, 1993

[30] Foreign Application Priority Data

Nov. 11, 1992 [JP] Japan ................... 4-325966

[51] Int. Cl.⁶ .................... B32B 15/00
[52] U.S. Cl. .......... 428/688; 428/216; 428/336; 428/325; 428/328; 428/329; 428/402; 428/457; 428/469; 428/472; 428/689; 428/698; 428/702; 361/230; 361/231; 174/5 SG
[58] Field of Search ............ 428/688, 689, 428/698, 402, 621, 627, 632, 216, 336, 325, 328, 329, 457, 469, 472; 501/87, 95, 97, 96; 361/230, 231; 174/5 SG

[56] References Cited

U.S. PATENT DOCUMENTS

| | | | |
|---|---|---|---|
| 4,480,284 | 10/1984 | Tojo | 361/230 |
| 4,612,296 | 9/1986 | Sakamoto | 501/93 |
| 4,665,463 | 5/1987 | Ward | 361/230 |
| 4,709,298 | 11/1987 | Hosono | 361/230 |
| 4,746,636 | 5/1988 | Yokoyama | 501/97 |
| 5,085,806 | 2/1992 | Yasutomi | 501/97 |
| 5,191,506 | 3/1993 | Logan | 361/230 |
| 5,196,385 | 3/1993 | Suzuki | 501/93 |
| 5,232,775 | 8/1993 | Chamberlain | 428/698 |
| 5,271,871 | 12/1993 | Yasutomi | 501/97 |

FOREIGN PATENT DOCUMENTS

| | | |
|---|---|---|
| 60-18081 | 5/1985 | Japan . |
| 61-14660 | 4/1986 | Japan . |
| 61-42418 | 9/1986 | Japan . |
| 64-81194 | 3/1989 | Japan . |
| 243699 | 10/1990 | Japan . |
| 4230904 | 8/1992 | Japan . |
| 454630 | 8/1992 | Japan . |
| 52303 | 1/1993 | Japan . |

*Primary Examiner*—Ellis Robinson
*Assistant Examiner*—Timothy M. Speer
*Attorney, Agent, or Firm*—Oblon, Spivak, McClelland, Maier & Neustadt, P.C.

[57] ABSTRACT

An electrification removing component comprising:

a ceramics for removing electrification of which surface resistivity is in a range of $2\times10^6$ through $10^{10}$ $\Omega/cm^2$; and an electric conductive material connected to the ground; said ceramics for removing electrification being electrically connected to the electric conductive material with an area by contact or bonding on surfaces of the ceramics for removing electrification and the electric conductive material.

20 Claims, 1 Drawing Sheet

ELECTRIFICATION REMOVING COMPONENT

BACKGROUND OF THE INVENTION

1. Field of the Invention

The present invention relates to an electrification removing component which is employed for preventing parts from electrical breakage by a rapid electric discharge which is caused in handling an electrified electronics related parts and the like.

2. Discussion of Background

There is a case wherein, in manufacturing steps of an electronics related part including a semiconductor device, the part is provided with an electric charge by a direct electrification or by an induced electrification. When the electrified part contacts an electric conductive material such as a metal and the like having a small electric resistance, a rapid discharge of an electric charge is often caused and the part is electrically broken (dielectric breakdown) by the discharge. It is an important problem to prevent the breakage of the part caused by this discharge.

As a ceramics having an electric conductive property, an electrically conductive ceramics of alumina added with an element of iron group and an element of 2A group or an element of 3A group, is disclosed, for instance, in Japanese Examined Patent Publication No. 54630/1992, and a sintered body of silicon nitride which is capable of working with an electric discharge machining and provided with a small specific resistivity, wherein a nitride or a carbide of Ti, Ta, Zr, and Hf is mixed with silicon carbide, in Japanese Examined Patent Publication No. 43699/1990. As a ceramics for the purpose of preventing electrification, a titania ceramics, a zirconia ceramics, a silicon nitride ceramics, or a silicon carbide ceramics, having a specific resistance of $10^2$ through $10^6$ $\Omega$.cm, which is attached to a holding part of metallic tweezers, is disclosed in Japanese Examined Utility Model Publication No. 2303/1993.

Further, a suction chuck is proposed in Japanese Unexamined Utility Model Publication No. 114441/1990, which is one for attracting a part for working or for measuring physical properties, and which prevents dusts from adhering on its suction face due to electrification, by employing ceramics having a specific resistivity of 10 through $10^5$ $\Omega$.cm. A vacuum conveyer (vacuum chuck) is proposed in Japanese Examined Patent Publication No. 42418/1986, of which surface contacting a silicon wafer is composed of a high-purity silicon carbide (of which surface resistivity is normally in a range of $10^3$ through $10^4$ $\Omega$/cm$^2$) and which does not contaminate an object to be handled.

However, these materials do not provide reliability for components employed in removing electrification by the following reasons. The first reason is that a voltage of static electricity charged on a part and the like is often as high as above 2000 V, and it has been revealed that a material with a level of specific resistivity of not more than $10^2$ $\Omega$.cm is not sufficient for protecting the part from an electric breakage when the discharge is caused and for removing the electric charge without destructing the part.

It is considered pertinent for a way of representing an electric resistance of a material for removing electrification by the surface resistivity in view of a mode of utilizing the material. However, no unified representation is currently adopted. In case of a uniform material, with respect to the surface resistivity and the specific resistivity, both generally agree with each other in most cases, although there is a case wherein measured values of these are different by a decimal digit. It is considered from these knowledges, that the surface resistivity which is suitable for the purpose of removing electrification is to be around $10^6$ through $10^{10}$ $\Omega$/cm$^2$. However, a suitable material showing the surface resistivity in this range has not been found in a material having a single composition.

On the other hand, a floor sheet for removing electrification wherein a plastics is kneaded with carbon powders and the like, has been reduced into practice. However, plastics are apt to deteriorate when a strong cleaning is performed thereon and give out dusts when they are worn. When the worn plastics contact an object to be handled, the object may be contaminated by the dusts. On the other hand, generally, ceramics are chemically stable, excellent in refractoriness and corrosion resistance and provided with an advantage wherein they are hard and difficult to wear. Therefore, ceramics are preferable materials for a component directly contacting an object to be handled that abhors contamination.

However, ceramics is provided with drawbacks wherein it is a brittle material and is easy to fracture, and much labor and cost are required for working it into a product; for instance, it is necessary to perform grinding by a diamond grinding wheel in working it into a required shape.

Further, in employing the ceramics for removing electrification for a component for removing electrification, it is necessary to electrically connect the ceramics for removing electrification to an electric conductive material that is connected to the ground. When the surface resistivity of the ceramics for removing electrification is as large as not less than $10^6$ $\Omega$/cm$^2$, and an electric conductive material such as a lead wire simply contacts the ceramics for removing electrification, the contact resistance is apt to be very large and unstable, and therefore, it is not possible to remove with certainty a charged static electricity from an object to be handled when the ceramics is used as the material for removing electrification.

SUMMARY OF THE INVENTION

With these conventional technologies as the background, it is an object of the present invention to provide an electrification removing component which is easy to use, and capable of certainly and instantly removing an electrified static electricity without destructing a part by an electric discharge, by directly contacting an electrification removing component to an object to be handled, in a device which handles an object that is easy to receive destruction by a rapid electric discharge of the electrified static electricity.

According to an aspect of the present invention, there is provided an electrification removing component comprising:

a ceramics for removing electrification of which surface resistivity is in a range of $2 \times 10^6$ through $10^{10}$ $\Omega$/cm$^2$; and an electric conductive material connected to the ground;

said ceramics for removing electrification being electrically connected to the electric conductive material with an area by contact or bonding on surfaces of the ceramics for removing electrification.

DETAILED DESCRIPTION OF THE PREFERRED EMBODIMENTS

Figure 1:
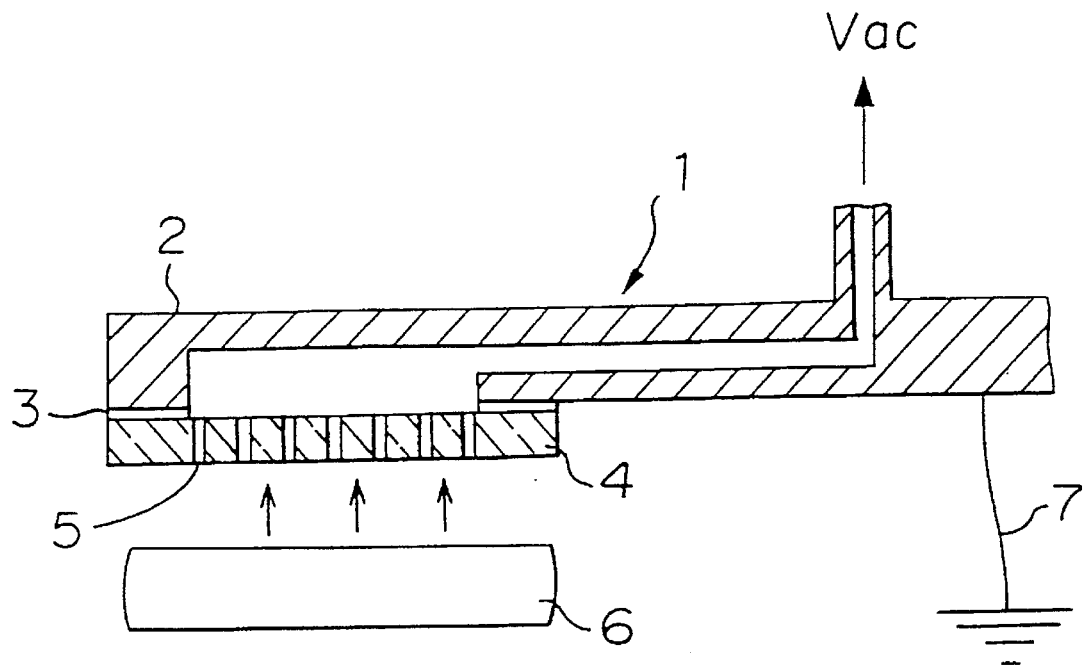
FIG. 1 is a sectional diagram of a vacuum chuck which is an example of an electrification removing component according to the present invention.

In an electrification removing component of this invention, it is possible to instantly remove a static electricity with certainty from an object to be handled which is electrified for instance, to 2000 V or more, without electrically destructing the object to be handled, since the electrification removing component of this invention is provided with a ceramics for removing electrification having a surface resistivity in a range of $2 \times 10^6$ through $10^{10}$ $\Omega/cm^2$. When the surface resistivity of the ceramics for removing electrification is smaller than $2 \times 10^6$ $\Omega/cm^2$ it is possible to electrically destruct the object to be handled by elevating the voltage of the electrified static electricity. On the other hand, when the surface resistivity is larger than $10^{10}$ $\Omega/cm^2$, the removing of the electrified static electricity may be difficult.

It is preferable to further restrict the range of the surface resistivity of the ceramics for removing electrification to $10^7$ through $9 \times 10^9$ $\Omega/cm^2$, in view of the function in use. Further, the function as the component for removing electrification is achieved by electrically connecting the ceramics on a surface with an area to an electric conductive material that is connected to the ground, whereby an electric charge that is transferred to the ceramics for removing electrification, is led to the ground with certainty through the electric conductive material. Although a ceramics having a surface resistivity of larger than $10^6$ $\Omega/cm^2$ is apt to be charged with static electricity, the static electricity is removed via the electric conductive material connected to the ground with certainty, dusts do not adhere to the ceramics for removing electrification because of an electrified static electricity, and the object to be handled is not contaminated by the dusts.

The ceramics for removing electrification having such a surface resistivity, can be provided, for instance, by distributing one kind or more of fine powders selected from the group of a nitride and a carbide of Ti, Zr, Hf, Nb and Ta, that are electric conductive inorganic compounds, in a ceramics whose major component is alumina or silicon nitride, that is an electric insulating material.

The electric conductive material is preferably a metal, which is easy to work. The electric conductive material and the ceramics for removing electrification are electrically connected by contact or by bonding, not with points but with an area on the surface. In this way, the component for removing electrification of this invention provides the function for removing electrification. The invented component prevents phenomena wherein an electric current is hard to flow because of the unstable contact resistance between the ceramics and an electric conductive material which is apt to be very large owing to the large surface resistivity of the ceramics for removing electrification.

The area of the contacted or bonded surface is preferably not less than 1 $mm^2$ and more preferably not less than 2 $mm^2$, thereby completely excluding a possibility wherein an electric contact resistance between the ceramics for removing electrification and the electric conductive material becomes unstable and may be very large or the connection therebetween is broken.

To provide the electric connection between the electric conductive material and the ceramics for removing electrification by contact, it is preferable, for instance, to dispose a metal sheet which is soft and hard to stain, between the ceramics for removing electrification and the electric conductive material, and to apply a mechanical pushing force thereon by screws, bolts or nuts. Then, the surface contact with an area is provided by deforming the soft metal sheet by the pushing force.

When the electric conductive material is a metal of which surface is easy to stain, there is a danger of enhancing the contact resistance. Therefore, the electric connection is preferably to be stabilized by performing a metallizing operation on the surface of the ceramics or by further bonding the ceramics to the electric conductive material. In case of the bonding, it is possible to provide simultaneously the electric connection and the bonding strength by procuring a bonding area of not less than 1 $mm^2$. The bonding can be performed by soldering by a solder for bonding ceramics, by brazing after a metallizing operation, by applying and baking an electric conductive paste, by applying an organic electric conductive adhesion material, or by employing a double-sided adhesion tape having an electric conductivity, in case wherein not much adhesion strength is not required.

For instance, a copper lead is employed for the grounding line. The electric connection between the electric conductive material and the grounding line can be provided even by a point contact since electric resistances of both are small. However, it is preferable to connect both by screws, soldering or brazing to avoid disconnection.

A preferable ceramics for removing electrification of this invention, is a sintered body wherein the ceramics for removing electrification includes one or more kinds of electric conductive compounds which are selected from nitrides and carbides of Ti, Zr, Hf, Nb and Ta, in a matrix whose major component is alumina, and of which relative density is not less than 90% (porosity including closed pores is not more than 10%). The relative density is obtained first by measuring a bulk density, calculating the porosity from the bulk density assuming that the density of the raw material powder does not change, and by subtracting the porosity from 100%.

Alumina has been known as an electric insulating material, and is preferable as a main matrix material of ceramics for removing electrification, since it is easy to obtain a raw material powder which is easy to sinter, is fine and is provided with a high purity. The inventors succeeded in providing a ceramics for removing electrification having the surface resistivity within a range of target and the relative density of not less than 90%, by forming a raw material powder mixture of alumina powder having an average particle size of not more than 5 μm and a powder of nitrides or carbides (the specific resistivity in a range of $10^{-4}$ through $10^{-5}$ $\Omega.cm$) of Ti, Zr, Hf, Nb and Ta having a similar average particle size of not less than 5 μm, and by sintering the formed body.

The raw material composition for providing the target surface resistivity varies with properties of a raw material powder, sintering conditions and the like. A sintered body having the target surface resistivity can be provided comparatively easily, by employing a raw material powder having an average particle size of not more than 5 μm, and by sintering a composition comprising 4 through 23 volume % of a powder of one or more electric conductive compounds selected from nitrides and carbides of Ti, Zr, Hf, Nb and Ta, and the balance of a raw material powder of a matrix whose major component is alumina.

With respect to the raw material powder of the ceramics, it is preferable to further mill the mixed raw material powder so as to obtain a dense and uniform sintered body, since the sintering performance is improved when the average particle size thereof is not more than 5 μm, and more preferably not more than 2 μm. It is efficient to mill the mixed raw material powder with a dispersion media of ethanol or the like, by a rotating ball mill, a vibration mill, attrition mill or the like.

The matrix of the sintered body, whose major component is alumina, may include inevitable impurities contained in a raw material powder, sintering aids such as $Y_2O_3$, MgO and the like for accelerating the sintering operation, or an additive such as MgO, $SiO_2$ and the like for preventing crystal growth. When the electric conductive compound is included, an effect of preventing the crystal growth of alumina can be provided. The ceramics for removing electrification having target material properties and an average crystal grain size of not more than 5 μm, for instance, 2 through 3 μm, can be provided stably by employing a raw material powder having an average particle size of not more than 5 μm.

The density of sintered body is limited to be not less than 90% in relative density (hereinafter simply density), to provide strength and wear resistance, since the larger the strength of the sintered body, the tougher the sintered body is, and the larger the wear resistance of the sintered body, the less the sintered body gives out dusts, whereby the ceramics for removing electrification has excellent durability. Further, the density of the sintered body is preferably not less than 93%, to eliminate hygroscopic property, by rendering all the pores of the sintered body to closed pores.

The normally performed die pressing, slip casting, injection molding, isostatic press molding and the like can be adopted for forming the mixed powder. In case of a formed body provided by the injection molding, a debonding treatment should be performed before the final sintering, since it contains a large amount of binder. The sintering of the formed body is performed by a pressureless sintering or by a hot pressing, in a nonoxidizing atmosphere, so that the electric conductive compound is not oxidized and the conductivity is not lost.

To create the nonoxidizing atmosphere in a furnace, the gas such as nitrogen, argon, helium or the like is introduced in the furnace, and the pressureless sintering is performed by maintaining the temperature in the furnace at 1550° through 1700° C. for 1 through 5 hours. To provide a more dense sintered body, the pressureless sintered body having the density of not less than 90%, is further sintered in a hot isostatic press. In case of the pressureless sintering and the hot isostatic pressing, the sintering can be performed even when the formed body is provided with a complicated shape.

Another preferable ceramics for removing electrification of this invention is a sintered body having the density of not less than 90%, wherein the ceramics for removing electrification includes SiC (silicon carbide) and one or more kinds selected from nitrides of Ti, Zr, Hf, Nb and Ta in a matrix composed of $Si_3N_4$ and sintering aids.

The ceramics for removing electrification whose major component is $Si_3N_4$, is provided with the surface resistivity within a target range and the strength of which is higher than that of the ceramics for removing electrification whose major component is alumina. That is, the bending strength of alumina ceramics for removing electrification is at a level of 25 through 35 kg/mm², whereas the bending strength of the silicon nitride ceramics for removing electrification can be at a level of not less than 50 kg/mm² easily. The latter can be utilized as a structural material. The silicon nitride ceramics for removing electrification can be provided by forming and sintering a mixed powder of 0.1 through 17 weight % of SiC powder having an average particle size of not more than 5 μm, 22 through 55 weight % of a powder having an average particle size of not more than 5 μm of one or more kinds selected from nitrides of Ti, Zr, Hf, Nb and Ta, and the balance of $Si_3N_4$ powder including a sintering aid or aids having an average particle size of not more than 5 μm.

SiC having an intermediate specific resistivity (not more than $10^2$ Ω.cm) is included in the ceramics for removing electrification, other than metal nitrides of Ti, Nb and the like, to facilitate the control of the surface resistivity of the sintered body. However, a formed mixed powder including SiC of more than 3 volume % is difficult to sinter densely by the pressureless sintering, and therefore, the sintering is preferably performed by hot pressing or by hot isostatic pressing.

Therefore, to enable the pressureless sintering of $Si_3N_4$ powder, a sintering aid or aids added thereto preferably by 2 through 15 weight % in a total of one or more kinds selected from MgO, $Al_2O_3$, $MgAl_2O_4$ and $Y_2O_3$, whereby a sintered body having a density of not less than 90% and a bending strength of not less than 60 kg/mm² can easily be provided.

A preferable content of TiN is 22 through 33 weight % for providing the ceramics for removing electrification having a surface resistivity within the target range and a large strength. Further, preferable contents of ZrN and/or NbN are 27 through 40 weight %, respectively. In either case, the content of SiC is preferably 1 through 12 weight %.

The method of making the silicon nitride ceramics for removing electrification is basically the same with that of the above mentioned alumina ceramics for removing electrification. However, in the method of making the silicon nitride ceramics, the sintering is performed at least in a nitrogen ($N_2$) containing atmosphere, preferably in an atmosphere including nitrogen ($N_2$) and silicon (Si) to prevent the sintering from hampering by the decomposition of $Si_3N_4$ into Si and $N_2$. The average particle size of a raw material powder is preferably finer than in case of making the alumina ceramics for removing electrification, and the raw material powder having an average particle size of not more than 5 μm, preferably 0.1 through 2 μm, is employed to provide a sintered body having a large density and a large bending strength.

The sintering conditions to provide the ceramics for removing electrification having the target surface resistivity and density, considerably vary with a degree of mixing the raw material powders, the particle size distribution, the forming condition and the composition. In case of performing the pressureless sintering, the sintering is performed normally at a sintering temperature of 1700° through 1800° C. for 1 through 10 hours.

In another preferable component for removing electrification of this invention, the ceramics for removing electrification is formed by thermal-spraying it on a metallic under coating layer which is formed on a metal substrate and the thermal expansion coefficient of the under coating layer is between those of the metal substrate and the ceramics layer.

Normally, the electric connection between an electric conductive material and another grounded electric conductive material can be performed by simply contacting them by screws or by springs. However, the electric connection by the simple contact between the ceramics for removing electrification having a surface resistivity not less than $2\times10^6$ Ω/cm² and an electric conductive material is devoid of reliability, since the contact resistance is unstable and may be very large. However, in a component for removing electrification wherein a metal substrate is integrated with a ceramics layer, there is no problem of electric connection therebetween. The connection of the metal substrate to the grounding line can be performed by the simple contact. However, it is preferable to connect them by soldering or by brazing with good reliability.

Further, the working of a metal is significantly easy compared with that of a ceramics, and the manufacturing cost is more inexpensive, and therefore, components for removing electrification having various shapes can be manufactured at a low cost, when the ceramics layer is formed on metal substrates which have previously been worked to the required shapes.

When, for instance, copper, stainless steel, aluminum and the like are used for the metal substrates, the thermal expansion coefficients of these are as large as 17 through $18 \times 10^{-6}/°C$. By contrast, the thermal expansion coefficients of $Al_2O_3$-$TiO_2$ ceramics layer and $Al_2O_3$-TiN ceramics layer, are as small as 8 through $9 \times 10^{-6}/°C$ and the difference of the thermal expansion coefficients therebetween is considerably large.

In another ceramics for removing electrification, the ceramics layer is formed by a thermal spraying, and hence the temperature of the metal substrate is elevated by the spraying. Although the thermal stress is not present or is very small when the temperature is elevated, a strain is caused in the vicinity of the boundary of the metal substrate and the ceramics layer due to the difference between the thermal expansion coefficients of both by cooling down to the room temperature, cracks are often generated in the ceramics layer and the ceramics layer is often peeled off from the metal substrate.

Accordingly, in the component for removing electrification of this invention, the thermal strain caused around the boundary of the metal substrate having a larger thermal expansion coefficient and the ceramics layer having a smaller thermal expansion coefficient, is reduced by previously providing a metallic under coating layer having a thermal expansion coefficient the value of which is between those of both, on the metal substrate. Thereby the ceramics layer is prevented from causing cracks due to the thermal strain and peeling from the metal substrate, and the metallic under coating layer procures a good electric connection between the ceramics layer and the metal substrate.

The metallic under coating layer may be formed by the plating, flame spraying, plasma spraying, sputtering, Mo—Mn method of metallizing, vapor deposition and the like. They are, for instance, of a metal or an alloy of Mo, Ti, Ni, Nb, Ta, W, Ni—Al, Ni—Cr, Ni—Cr—Al, Ni—Cr—Al—Y, Ni—Co—Cr—Al—Y or the like.

It is preferable to form the metallic under coating layer especially by the plasma spraying method. The first reason is that it is possible to prevent the oxidation of a metal by spraying the metal in a nonoxidizing atmosphere. Further, by the plasma spraying method, since the temperature can be high and the selection of a metal to be undercoated is wide and it is easy to form a rather thick under coating layer or an under coating layer having a two-sublayer structure.

The thermal expansion coefficients of these metallic under coating layers are preferably in a range of 12 through $15 \times 10^{-6}/°C$. More preferably, the under coating layer is constructed by plural sublayers having different thermal expansion coefficients, and the thermal expansion coefficient of an under coating sublayer on the side of the ceramics layer is more proximate to the thermal expansion coefficient of the ceramics layer than that of another under coating sublayer on the side of the metal substrate.

When the difference between the thermal expansion coefficient of the under coating sublayer on the side of the ceramics layer and that of the ceramics layer is smaller than $2 \times 10^{-6}/°C$., a component for removing electrification with no apprehension of the peeling-off of the ceramics layer can be provided. As the metallic under coating layers having a small thermal expansion coefficient, there are Ti, Nb, W, Mo, Ta and alloys including these metals.

The thickness of the under coating layer may be small so far as the thermal stress due to the difference between the thermal expansions of the metal substrate and the ceramics layer can be reduced and the ceramics layer can be stably formed on the under coating layer. When the difference between the thermal expansions of both is large, a rather thick under coating layer is preferred. When the under coating layer is constructed by two sublayers, the thickness of the under coating layer is preferably 30 through 150 μm, more preferably 80 through 120 μm.

Further, another component for removing electrification of this invention is provided with practically sufficient strength and toughness by integrating the ceramics layer with the metal substrate, even if the strength of the ceramics layer is small and the thickness thereof is small. The component for removing electrification integrated with the metal substrate can easily be integrated with a machine since it is easy to work the metal substrate into a desired shape compared with the ceramics for removing electrification.

In forming the metallic under coating layer, it is possible to promote the adhesion strength of the under coating layer with respect to the metal substrate by previously gritblasting the surface of the metal substrate by abrasive grains of alumina or silicon carbide into a roughened surface. Further, the adhesion strength of the metallic under coating layer is further promoted by cutting grooves or screws on the surface of the metal substrate, and further by grit-blasting the surface provided with the grooves and the screws. The thickness of the under coating layer is pertinent to be approximately 30 through 150 μm, such that the ceramics layer having a good adhesion strength can be formed.

In another preferable component for removing electrification of this invention, the spraying material of the ceramics layer is selected to include alumina and titanium oxide and/or titanium nitride. The reason is that a ceramics layer having the surface resistivity within the target range can reproducibly be formed by thermal spraying. Further, it is easy to obtain a raw material powder of alumina having high-purity and a pertinent average particle size that is easy to spray, and the formed ceramics layer is chemically stable and provided with a high hardness and wear resistance.

Both of the necessary contents of a titanium oxide and a titanium nitride which are the minor components in the ceramics layer, are preferably 5 through 50 weight %, although depending on the spraying conditions. Further, it is preferable to form the ceramics layer by the plasma spraying method, since it is easy to control the surface resistivity in the narrow target range.

It is preferable to employ a sintered spray powder having a predetermined composition for the spray powder forming the ceramics layer, to form a uniform ceramics layer having a required surface resistivity. For instance, a powder having an average particle size which is easy to spray, for instance, a powder having an average particle size of 10 through 75 μm, may be employed by milling a sintered body having a predetermined composition. When the average particle size is smaller than 10 µm, the supply of the powder to the spraying device is difficult. When the average particle size is larger than 75 µm, the powder particle is difficult to melt in the hot gas, and a dense ceramics layer is difficult to form.

It is preferable to form the ceramics layer having a thickness not less than 100 µm, since a stable and reproducible surface resistivity can easily be provided. Further, when the metallic under coating layer is of a two-sublayer structure, the adhesion strength of the ceramics layer is promoted and a thick ceramics layer can be formed. However, when a thick ceramics layer is formed, the ceramics layer is apt to peel off and the time necessary for thermal spraying is prolonged. Therefore, the thickness of the ceramics layer is preferably not to be larger than 2 mm.

In another preferable component for removing electrification of this invention, the component for removing electrification is at least a portion of a manipulator or a carrier handling electronics related parts.

A manipulator is a so-called robot hand, which is provided with the component for removing electrification of this invention, for instance, at ends of fingers (there should be at least two fingers in this case) for grabbing an object to be handled. When the object to be handled is provided with static electricity, the static electricity is mildly discharged and removed through the ceramics for removing electrification, and the static electricity flows to the ground. Therefore, the electric charge of the object is removed and at the same time, the object is not electrically destructed by a rapid discharge.

The carrier is for instance a vacuum chuck, which is attached with the component for removing electrification at a portion of the vacuum chuck contacting the object to be handled. In a similar way, the electric charge is removed without destructing the object to be handled by the rapid discharge of the electrified electric charge.

In another preferable component for removing electrification of this invention, an electric conductive material of the component for removing electrification is electrically connected to a metal frame of a device handling electronics related parts, which is connected to the ground.

In this constitution the total length of the grounding line can significantly be shortened for connecting the electric conductive material to the ground. When the component for removing electrification moves with respect to the gravity center of the device, it is possible to provide the grounding line without pulling or hanging by disposing the grounding line along an arm which is attached with the component for removing electrification, or utilizing the arm of an electric conductive material as a portion of the grounding line.

EXAMPLE

A specific explanation will be given of the present invention by examples as follows. However, the present invention is not restricted by these examples.

TEST EXAMPLES 1 through 51

An alumina powder (Sumitomo Chemical Co.; AKP-50) having an average particle size of 0.26 µm and purity of 99.99% was mixed with a powder or powders having an average particle size of 1 through 2 µm and purity of approximately 99% selected from titanium nitride (TIN), zirconium nitride (ZrN), titanium carbide (TIC), zirconium carbide (ZrC) (each made by H. C. Starch), hafnium nitride (HfN), hafnium carbide (HfC), niobium nitride (NbN), niobium carbide (NbC), tantalum nitride (TaN) and tantalum carbide (TaC) (each made by Japan New Metals Co.), into compositions including 1 through 30 volume % of nitrides and/or carbides shown in Tables 1 and 3. The mixing was performed with ethanol as a dispersion media by a vibration mill employing a nylon pot and nylon balls.

The obtained slurries were dried under reduced pressure at approximately 60° C. thereby removing ethanol. The dried materials were crushed and mixed powders for forming were provided. These mixed powders were pressed by a uniaxial mode press under pressure of 100 kg/cm² into formed bodies each having dimensions of 50 mm×120 mm×10 mm, which were pressed again by an isostatic press under pressure of 2000 kg/cm².

The formed bodies were pressureless-sintered at 1550 through 1700° C. for three hours in a nonoxidizing atmosphere of argon. Flat plates each having dimensions of 30 mm×30 mm×2 mm were cut out from each sintered body, whereby the measurement of the surface resistivity was performed on each wheel-ground surface, and five test pieces having dimensions of 3 mm×4 mm×40 mm were cut out from each sintered body whereby the three-point bending strengths were measured.

For tests for the charge removing properties and discharge properties, an end of each latter cut-out test piece was metallized, which was brazed to a distal end of a metal bar. The metal bar was connected to the ground, and each end of test piece contacted a line which was connected to a previously electrified metal plate, thereby observing the charge removing and discharging situations and evaluating the properties as the component for removing electrification.

These test results are shown in Tables 2 and 4 along with the density of sintered body. The results of the charge removing properties and the discharging properties are shown by o which indicates "good", and X, "poor". That is, the charge removing properties are good when the electrified electric charge has substantially been removed, and the discharging properties are good when a discharging rate of the electric charge (a lowering rate of an electric potential which is measured by an instrument) is not too fast (in this test, a half life of an electric potential is in a range of 0.5 through 8 msec). Further, in these Tables test No. 1, 2, 3, 20, 21, 22, 23, 24, 25, 46, 47, 48, 49, 50 and 51 are comparative examples and the others are examples of this invention.

TABLE 1

| Test No. | $Al_2O_3$ Powder Vol. % | TiN Powder Vol. % | TiC Powder Vol. % | ZrN Powder Vol. % | ZrC Powder Vol. % |
| --- | --- | --- | --- | --- | --- |
| 1* | 99 | 1 | — | — | — |
| 2* | 97 | 3 | — | — | — |
| 3* | 97 | — | — | 3 | — |
| 4 | 95 | 5 | — | — | — |
| 5 | 93 | 7 | — | — | — |
| 6 | 90 | 10 | — | — | — |
| 7 | 90 | — | — | — | 10 |
| 8 | 87 | 13 | — | — | — |
| 9 | 87 | — | 13 | — | — |
| 10 | 87 | 10 | — | 3 | — |
| 11 | 85 | 15 | — | — | — |
| 12 | 85 | — | — | 15 | — |
| 13 | 85 | 10 | — | 5 | — |
| 14 | 85 | — | — | — | 15 |
| 15 | 83 | 17 | — | — | — |
| 16 | 80 | 20 | — | — | — |
| 17 | 80 | — | — | 20 | — |
| 18 | 78 | 22 | — | — | — |
| 19 | 78 | — | — | 22 | — |
| 20* | 75 | 25 | — | — | — |
| 21* | 75 | — | — | — | 25 |
| 22* | 70 | 30 | — | — | — |
| 23* | 70 | — | 30 | — | — |

TABLE 2

| Test No. | Sintered body density (%) | Three-point bending strength (kg/mm²) | Surface resistivity (Ω/cm²) | Charge removing properties | Discharging properties |
|---|---|---|---|---|---|
| 1* | 94.7 | 31.5 | $4 \times 10^{12}$ | X | O |
| 2* | 95.5 | 30.8 | $2 \times 10^{12}$ | X | O |
| 3* | 92.8 | — | $8 \times 10^{11}$ | X | O |
| 4 | 95.3 | 29.8 | $8 \times 10^{9}$ | O | O |
| 5 | 95.0 | 28.5 | $6 \times 10^{9}$ | O | O |
| 6 | 95.4 | 33.0 | $3 \times 10^{9}$ | O | O |
| 7 | 93.8 | 35.7 | $4 \times 10^{9}$ | O | O |
| 8 | 93.0 | 30.6 | $1 \times 10^{9}$ | O | O |
| 9 | 94.5 | 27.3 | $9 \times 10^{8}$ | O | O |
| 10 | 94.0 | 35.4 | $7 \times 10^{8}$ | O | O |
| 11 | 93.3 | 33.2 | $2 \times 10^{8}$ | O | O |
| 12 | 92.8 | 30.0 | $3 \times 10^{8}$ | O | O |
| 13 | 93.0 | 31.5 | $2 \times 10^{8}$ | O | O |
| 14 | 93.8 | 29.1 | $3 \times 10^{8}$ | O | O |
| 15 | 94.1 | 31.0 | $5 \times 10^{7}$ | O | O |
| 16 | 93.3 | 34.9 | $1 \times 10^{7}$ | O | O |
| 17 | 92.5 | 27.2 | $1 \times 10^{7}$ | O | O |
| 18 | 93.5 | 30.5 | $8 \times 10^{6}$ | O | O |
| 19 | 93.0 | 29.8 | $3 \times 10^{6}$ | O | O |
| 20* | 92.2 | 28.1 | $4 \times 10^{-3}$ | O | X |
| 21* | 92.9 | — | $3 \times 10^{-3}$ | O | X |
| 22* | 93.0 | — | $5 \times 10^{-4}$ | O | X |
| 23* | 93.1 | — | $4 \times 10^{-4}$ | O | X |

TABLE 3

| Test No. | Al₂O₃ Powder Vol. % | HfN Powder Vol. % | HfC Powder Vol. % | NbN Powder Vol. % | NbC Powder Vol. % | TaN Powder Vol. % | TaC Powder Vol. % |
|---|---|---|---|---|---|---|---|
| 24* | 97 | 3 | — | — | — | — | — |
| 25* | 97 | — | — | 3 | — | — | — |
| 26 | 95 | 5 | — | — | — | — | — |
| 27 | 95 | — | — | — | — | 5 | — |
| 28 | 90 | — | 10 | — | — | — | — |
| 29 | 90 | — | — | 10 | — | — | — |
| 30 | 90 | — | — | — | 10 | — | — |
| 31 | 90 | — | — | — | — | — | 10 |
| 32 | 90 | 5 | — | — | — | 5 | — |
| 33 | 85 | 15 | — | — | — | — | — |
| 34 | 85 | — | — | — | 15 | — | — |
| 35 | 85 | — | 10 | — | 5 | — | — |
| 36 | 85 | — | — | — | 10 | — | 5 |
| 37 | 82 | 18 | — | — | — | — | — |
| 38 | 82 | — | — | 18 | — | — | — |
| 39 | 82 | — | — | — | — | 18 | — |
| 40 | 80 | 20 | — | — | — | — | — |
| 41 | 80 | — | 20 | — | — | — | — |
| 42 | 80 | 15 | 5 | — | — | — | — |
| 43 | 80 | — | — | — | — | — | 20 |
| 44 | 78 | — | — | 22 | — | — | — |
| 45 | 78 | — | — | — | — | 22 | — |
| 46* | 75 | 25 | — | — | — | — | — |
| 47* | 75 | 20 | — | 5 | — | — | — |
| 48* | 75 | — | — | — | 10 | — | 15 |
| 49* | 70 | — | 30 | — | — | — | — |
| 50* | 70 | — | — | 30 | — | — | — |
| 51* | 70 | 15 | — | — | — | 15 | — |

TABLE 4

| Test No. | Sintered body density (%) | Three-point bending strength (kg/mm²) | Surface resistivity (Ω/cm²) | Charge removing properties | Discharging properties |
|---|---|---|---|---|---|
| 24* | 94.5 | 32.8 | $>10^{12}$ | X | O |
| 25* | 93.2 | 38.6 | $>10^{12}$ | X | O |

TABLE 4-continued

| Test No. | Sintered body density (%) | Three-point bending strength (kg/mm²) | Surface resistivity (Ω/cm²) | Charge removing properties | Discharging properties |
|---|---|---|---|---|---|
| 26 | 96.0 | 34.2 | $6 \times 10^{9}$ | O | O |
| 27 | 94.8 | 32.9 | $6 \times 10^{9}$ | O | O |
| 28 | 93.3 | 33.5 | $4 \times 10^{9}$ | O | O |
| 29 | 94.1 | 36.0 | $1 \times 10^{9}$ | O | O |
| 30 | 94.7 | 31.3 | $7 \times 10^{9}$ | O | O |
| 31 | 95.7 | 28.3 | $3 \times 10^{8}$ | O | O |
| 32 | 93.0 | 30.7 | $1 \times 10^{9}$ | O | O |
| 33 | 95.5 | 30.3 | $8 \times 10^{8}$ | O | O |
| 34 | 94.2 | 28.7 | $3 \times 10^{9}$ | O | O |
| 35 | 93.8 | 33.1 | $3 \times 10^{8}$ | O | O |
| 36 | 93.7 | 39.2 | $1 \times 10^{8}$ | O | O |
| 37 | 94.1 | 32.9 | $6 \times 10^{8}$ | O | O |
| 38 | 93.3 | 37.1 | $2 \times 10^{9}$ | O | O |
| 39 | 93.3 | 37.3 | $5 \times 10^{8}$ | O | O |
| 40 | 92.6 | 36.5 | $2 \times 10^{7}$ | O | O |
| 41 | 93.6 | 31.0 | $8 \times 10^{7}$ | O | O |
| 42 | 93.5 | 29.9 | $1 \times 10^{8}$ | O | O |
| 43 | 92.8 | 31.3 | $3 \times 10^{6}$ | O | O |
| 44 | 92.9 | 30.5 | $4 \times 10^{7}$ | O | O |
| 45 | 94.0 | 32.2 | $6 \times 10^{6}$ | O | O |
| 46* | 92.1 | 30.7 | $9 \times 10^{0}$ | O | X |
| 47* | 92.5 | 29.8 | $2 \times 10^{1}$ | O | X |
| 48* | 91.3 | 31.9 | $3 \times 10^{0}$ | O | X |
| 49* | 92.8 | 27.4 | $3 \times 10^{-3}$ | O | X |
| 50* | 93.0 | 31.7 | $7 \times 10^{-3}$ | O | X |
| 51* | 92.9 | 32.0 | $4 \times 10^{-4}$ | O | X |

The above test results reveal that the alumina ceramics for removing electrification of this invention are provided with surface resistivities in a range of $2 \times 10^{6}$ through $10^{10}$ Ω/cm², and the components for removing electrification integrated with the alumina ceramics for removing electrification and the grounded electric conductive materials show good charge removing properties.

Further, the bending strength of the ceramics for removing electrification is in a range of 27 through 39 kg/mm² which is a high strength level as alumina ceramics, and the component for removing electrification integrated with the alumina ceramics for removing electrification of this invention and the electric conductive material shows high reliability.

TEST EXAMPLES 61 THROUGH 82

Si₃N₄ powder (Ube industries; SN-E10) having an average particle size of 0.7 μm, an electric conductive metal nitride powder or powders having an average particle size of 1 through 2 μm and purity of approximately 99%, selected from titanium nitride (TIN), zirconium nitride (ZrN), hafnium nitride (HfN), niobium nitride (NbN) and tantalum nitride (TAN) (each made by Japan New Metals Co.), SiC powder having an average particle size of 0.6 μm (Showa Denko K. K.; A-1), and sintering aid or aids shown in Table 5 were mixed by ratios (weight %) shown in Table 5.

The prepared powders were put into a rotating ball mill employing a nylon resin pot and Si₃N₄ balls and were mixed with ethanol as a dispersion media. In Table 5, weight % of a total quantity of Si₃N₄ powder and a powder of a sintering aid or aids with respect to a total of mixed powders is shown on the column of Si₃N₄, and weight % of a respective powder of a sintering aid with respect to a total of Si₃N₄ powder and the powder of a sintering aid or aids is shown on the sintering aid columns.

Slurries of the mixed powders prepared by the wet-milling were dried under reduced pressure while heating them at approximately 60° C. thereby removing ethanol. The dried materials were crushed whereby powders for forming ceramics for removing electrification were provided. These powders were put into a mold, pressed under pressure of 200 kg/cm$^2$, formed into bodies having dimensions of 50 mm×120 mm×10 mm, and were pressed again by an isostatic press under pressure of 2000 kg/cm$^2$.

These formed bodies were pressureless-sintered at 1730° C. through 1770° C. in nitrogen atmosphere for approximately two hours. Thereafter, further sintering was performed at 1750° C. under nitrogen gas pressure of 100 kg/cm$^2$ for two hours with resect to some samples, thereby providing more dense sintered bodies. They are Test Nos. of 72 through 74 in Tables 5 and 6.

A flat plate of 30 mm×30 mm×2 mm was cut out from each sintered body whereby the measurement of the surface resistivity was performed on each wheel-ground surface and five test species of 3 mm×4 mm×40 mm were cut out from each sintered body whereby the three-point bending strengths were measured. As the tests for the charge removing properties and the discharging properties of each samples, an end of a cut-out test piece of 3 mm×4 mm×40 mm was metallized and the each metallized end was brazed to a distal end of a metal bar. The metal bar was connected to the ground, and the other end of the test piece touched to a previously electrified metal plate, thereby observing the charge removing and the discharging situations and evaluating the properties as the component for removing electrification.

These results of evaluation are shown in Table 6 along with the density and the bending strength of the each sintered body. The results of evaluation of the charge removing and the discharge properties in Table 6 are shown by ○ which indicates "good" Δ, a little problematic (may be poor depending on electrification conditions) and X, "poor". Among these, the test examples 61, 62, 63, 64, 67, 81 and 82 are comparative examples and the others are examples of this invention.

TABLE 6

| Test No. | Sintered body density (%) | Three-point bending strength (kg/mm$^2$) | Surface resistivity (Ω/cm$^2$) | Charge removing properties | Discharging properties |
|---|---|---|---|---|---|
| 61* | 96.5 | 91.9 | >1 × 10$^{12}$ | X | ○ |
| 62* | 95.1 | 88.2 | >1 × 10$^{12}$ | X | ○ |
| 63* | 88.5 | 55.6 | 9 × 10$^{10}$ | Δ | ○ |
| 64* | 94.3 | 70.5 | 1 × 10$^{11}$ | X | ○ |
| 65 | 94.3 | 70.5 | 1 × 10$^{10}$ | ○ | ○ |
| 66 | 91.2 | 65.2 | 1 × 10$^{10}$ | ○ | ○ |
| 67* | 92.3 | 68.3 | 2 × 10$^{10}$ | Δ | ○ |
| 68 | 94.0 | 71.7 | 8 × 10$^{9}$ | ○ | ○ |
| 69 | 93.3 | 70.3 | 2 × 10$^{9}$ | ○ | ○ |
| 70 | 92.2 | 65.8 | 2 × 10$^{9}$ | ○ | ○ |
| 71 | 91.8 | 63.0 | 5 × 10$^{9}$ | ○ | ○ |
| 72 | 92.0 | 68.2 | 4 × 10$^{8}$ | ○ | ○ |
| 73 | 92.7 | 67.4 | 9 × 10$^{8}$ | ○ | ○ |
| 74 | 95.5 | 85.3 | 3 × 10$^{8}$ | ○ | ○ |
| 75 | 96.2 | 87.0 | 5 × 10$^{8}$ | ○ | ○ |
| 76 | 94.8 | 79.7 | 8 × 10$^{9}$ | ○ | ○ |
| 77 | 94.6 | 75.3 | 6 × 10$^{7}$ | ○ | ○ |
| 78 | 95.1 | 72.4 | 4 × 10$^{7}$ | ○ | ○ |
| 79 | 94.3 | 79.0 | 2 × 10$^{7}$ | ○ | ○ |
| 80 | 93.3 | 72.5 | 9 × 10$^{6}$ | ○ | ○ |
| 81* | 94.1 | 73.6 | <1 × 10$^{4}$ | ○ | X |
| 82* | 94.6 | 75.6 | <1 × 10$^{4}$ | ○ | X |

The results shown in Tables 5 and 6 reveal that all the components for removing electrification integrated with the silicon nitride ceramics for removing electrification are provided with the surface resistivity in a range of 2×10$^6$ through 10$^{10}$ Ω/cm$^2$ and the grounded electric conductive materials show good charge removing property. The bending strengths of the silicon nitride ceramics for removing electrification show high-strength values of not less than 60 kg/cm$^2$ in all the sintered bodies, which shows that the component for removing electrification of this invention is provided with an excellent reliability along with the charge removing properties.

TABLE 5

| Test No. | Si$_3$N$_4$ | MgO | Al$_2$O$_3$ | MgAl$_2$O$_4$ | Y$_2$O$_3$ | SiC | TiN | ZrN | HfN | NbN | TaN |
|---|---|---|---|---|---|---|---|---|---|---|---|
| 61* | 84 | 2 | — | — | — | — | 16 | — | — | — | — |
| 62* | 80 | 2 | — | — | — | — | 20 | — | — | — | — |
| 63* | 56 | 2 | 5 | — | 5 | 19 | — | 25 | — | — | — |
| 64* | 73 | — | — | 5 | 5 | — | 27 | — | — | — | — |
| 65 | 63 | 2 | 5 | — | 5 | 14 | 23 | — | — | — | — |
| 66 | 59 | 2 | 5 | — | 5 | 13 | — | — | — | 28 | — |
| 67* | 70 | — | — | 5 | 5 | 3 | 27 | — | — | — | — |
| 68 | 68 | — | 5 | — | 5 | 5 | 27 | — | — | — | — |
| 69 | 62 | — | 5 | — | 5 | 4 | — | 34 | — | — | — |
| 70 | 48 | — | 5 | — | 5 | 3 | — | — | — | 49 | — |
| 71 | 66 | — | — | 5 | 5 | 7 | 27 | — | — | — | — |
| 72 | 64 | 2 | 5 | — | 5 | 9 | 27 | — | — | — | — |
| 73 | 45 | — | — | 5 | 5 | 6 | — | — | 49 | — | — |
| 74 | 71 | — | 5 | — | 5 | 1 | 28 | — | — | — | — |
| 75 | 64 | — | — | 5 | 5 | 1 | — | 35 | — | — | — |
| 76 | 63 | — | — | 5 | 5 | 2 | — | — | 35 | — | — |
| 77 | 69.5 | — | 5 | — | 5 | 0.5 | 30 | — | — | — | — |
| 78 | 54.7 | — | 5 | — | 5 | 0.3 | — | 16 | 29 | — | — |
| 79 | 67.8 | — | — | 5 | 5 | 0.2 | 32 | — | — | — | — |
| 80 | 60.8 | — | 5 | — | 5 | 0.2 | — | — | 39 | — | — |
| 81* | 64 | — | — | 5 | 5 | — | 36 | — | — | — | — |
| 82* | 40 | — | 5 | — | 5 | — | — | — | — | — | 60 |

TEST EXAMPLES 91 through 110

Lumps of sintered body were provided by sintering mixtures of an alumina powder having purity of 99.5 weight % and a $TiO_2$ powder (purity; 99.5 weight %) and mixtures of the alumina powder and a TiN powder (purity; 99.5 weight %), having compositions shown in Table 7 respectively at 1500° C. and 1600° C. in nonoxidizing atmospheres, to obtain ceramics powders for forming ceramics layers by thermal spraying. The lumps were crushed and sieved, thereby providing 20 kinds of ceramic powders for spraying having particle sizes in a range of 10 through 45 μm.

On the other hand, aluminum plates having dimensions of 20 mm×50 mm×10 mm were adopted as metal substrates, of which 20 mm×50 mm surface were grit-blasted into roughened surfaces by alumina abrasive grains. A Ni—Al (content ratio 8:2) alloy powder (particle sizes; 10 through 45 μm) was plasma-sprayed (employing plasma spraying device of Perkin Elmer Corp. Metco Div.) on the roughened surfaces, thereby forming under coating layers having a thickness of about 100 μm.

A mixture gas of Ar and $H_2$ (volume ratio 8:2) is employed as plasma gas in the plasma spraying. The mixture gas flowed at a flow rate of 42.5 l per minute, and a power of 35 kv and 700 A was applied, thereby forming a plasma gas flow of 10,000° through 20,000° C. The Ni—Al alloy powder was carried by the plasma gas flow which was instantaneously heated into a semi-molten state and was sprayed on the metal substrate. At this occasion, a first under coating sublayer was formed having a thickness of approximately 50 μm by sweeping a plasma spraying gun in the left and right directions.

In a similar way, a Ti powder was plasma-sprayed on the first under coating sublayer, and a second under coating sublayer having a thickness of about 50 μm was formed. When the thermal expansion coefficients were measured by peeling off another under coating sublayer which had been sprayed so as to be peeled off easily, the thermal expansion coefficient of the first under coating sublayer and the second under coating sublayer were found to be respectively $12.5\times 10^{-6}$/°C. and $8.5\times 10^{-6}$/°C.

Next, the aforementioned various ceramics powders for spraying were plasma-sprayed on the second under coating sublayer and ceramics layers having thicknesses of 200 through 1000 μm were formed, thereby providing samples of 20 kinds of components for removing electrification. The adhesion strengths of the ceramics layers to the metal substrate with respect to all the samples of these components for removing electrification were good and no peeling-off was observed, the porosities of all the ceramics layers were as small as not more than 4%, the hardnesses were large and the wear resistances were excellent.

The surface resistivities were measured with ground surfaces of the ceramics layers of these components for removing electrification. As the test for the charge removing properties and the discharging properties, the metal substrate of each component for removing electrification was bonded to a distal end of a grounded metal bar by brazing. Further, the ceramics layer of each component for removing electrification contacted a lead line connected to a metal plate which had previously been electrified to 2000 V, thereby observing the charge removing and the discharging situations and evaluating whether the sample was pertinent as the component for removing electrification. The test results are also shown in Table 7.

TABLE 7

| Test No. | $Al_2O_3$ Powder Weight % | $TiO_2$ Powder Weight % | $TiN_2$ Powder Weight % | Approximate thickness of ceramics layer μm | Surface resistivity ($\Omega/cm^2$) | Charge removing properties | Discharging properties |
| --- | --- | --- | --- | --- | --- | --- | --- |
| 91* | 97 | 3 | — | 300 | $5 \times 10^{11}$ | X | O |
| 92* | 95 | 5 | — | 500 | $9 \times 10^{10}$ | Δ | O |
| 93* | 90 | 10 | — | 400 | $7 \times 10^{10}$ | Δ | O |
| 94 | 85 | 15 | — | 200 | $4 \times 10^9$ | O | O |
| 95 | 80 | 20 | — | 500 | $2 \times 10^8$ | O | O |
| 96 | 75 | 25 | — | 500 | $1 \times 10^8$ | O | O |
| 97 | 70 | 30 | — | 1000 | $7 \times 10^7$ | O | O |
| 98 | 65 | 35 | — | 400 | $2 \times 10^7$ | O | O |
| 99 | 60 | 40 | — | 500 | $6 \times 10^6$ | O | O |
| 100 | 55 | 45 | — | 600 | $4 \times 10^6$ | O | O |
| 101* | 50 | 50 | — | 400 | $1 \times 10^6$ | O | Δ |
| 102* | 47 | 53 | — | 500 | $8 \times 10^5$ | O | X |
| 103* | 97 | — | 3 | 400 | $3 \times 10^{11}$ | X | O |
| 104* | 95 | — | 5 | 300 | $8 \times 10^{10}$ | Δ | O |
| 105* | 90 | — | 10 | 400 | $2 \times 10^{10}$ | Δ | O |
| 106 | 85 | — | 15 | 300 | $2 \times 10^9$ | O | O |
| 107 | 80 | — | 20 | 500 | $3 \times 10^8$ | O | O |
| 108 | 75 | — | 25 | 500 | $4 \times 10^7$ | O | O |
| 109 | 70 | — | 30 | 900 | $8 \times 10^6$ | O | O |
| 110* | 67 | — | 33 | 400 | $4 \times 10^5$ | O | X |

Among these test examples, Nos. 91, 92, 93, 101, 102, 103, 104, 105 and 110 are comparative examples of this invention and the others are the examples of this invention. The test results of the charge removing and the discharging properties are shown by o which indicates "good", Δ, a little problematic (may be poor depending on electrification condition) and X, "poor". Further, ceramics layers were plasma-sprayed on a metal substrate not provided with an under coating layer, and the thermal expansion coefficient of the peeled-off ceramics layers were measured, which were in a range of 7 through $9\times 10^{-6}$/°C.

The above test results reveal that the invented component for removing electrification wherein the ceramics layer is provided with the surface resistivity in a range of $2\times 10^6$ through $10^{10}$ $\Omega/cm^2$, shows excellent charge removing properties.

Further, in a separate test, an aluminum disk having a diameter of 200 mm and a thickness of 10 mm was fixed on a lathe, which was rotated at 10 rpm. The surface of the disk was grit-blasted by alumina abrasive grains into a roughened surface. An under coating layer was provided on the roughened surface as in the method of the above test examples, and a component for removing electrification formed with a ceramic layer having the composition the same as in Test No. 94, was formed.

The ceramics layer of the component for removing electrification showed the surface resistivity approximately the same as in Test No. 94, and it was found that the component was suitable for removing the electrification from semiconductor parts, when the metal substrate was connected to the ground and was employed as a working table for handling the semiconductor parts.

Figure 2:
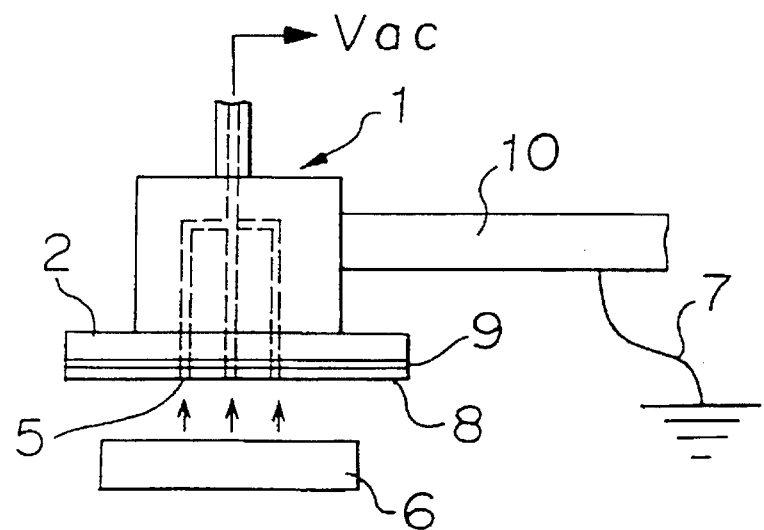
FIG. 2 is a side diagram of a vacuum chuck which is another example of an electrification removing component according to the present invention.

FIG. 1 is a sectional diagram of a vacuum chuck showing an example of a component for removing electrification according to the present invention. In FIG. 1, reference numeral 1 designates a vacuum chuck, 2, a metal substrate, 3, a brazing layer, 4, a ceramics for removing electrification, 5, suction holes connected to a vacuum pump, not shown, 6, an object to be handled and 7, the ground. Further, FIG. 2 is a side diagram of a vacuum chuck showing another example of a component for removing electrification according to the present invention. In FIG. 2, numeral 8 designates a ceramics layer which has been plasma-spayed, 9, an under coating layer and 10, an operating arm.

In the test, stainless steel (SUS 304) was employed for the metal substrate 2 of FIG. 1, the alumina sintered body of Test No. 8 (surface resistivity; $1 \times 10^9$ $\Omega/cm^2$, density; 93%) is employed for the ceramics 4 for removing electrification provided with a number of suction holes 5, a surface of the ceramics for removing electrification was metallized and the metal substrate was brazed to the surface.

Further, a stainless steel plate was employed for the metal substrate 2 of FIG. 2, the under coating layer 9 having a two-sublayer structure as in the above examples was provided on the surface of the metal substrate 2 on the side of attracting the object 6 to be handled, an alumina powder containing 15 weight % of $TiO_2$ was plasma-sprayed thereby forming the ceramics layer 8 having a thickness of 400 μm, and the surface of the ceramics layer 8 was ground flat thereby forming a vacuum chuck 1 which is a kind of component for removing electrification. The surface resistivity of the ground surface of the ceramics layer 8 of the vacuum chuck was measured to be $3 \times 10^8$ $\Omega/cm^2$.

When a metal plate which had been electrified at 2000 V as the object to be handled, were attracted by these two kinds of vacuum chucks of which metal substrates were connected to the ground, electric discharges were performed after contacting in approximately 3 and 1.4 msec from 2000 V to 200 V, respectively, and the invented components were found to be suitable as the components for removing electrification.

The invented components for removing electrification are provided with the charge removing properties which are suitable for preventing circuits of electronic parts from destructing by rapidly discharging electric charges which have been electrified to the electronic parts and the like, in steps of manufacturing the electronic parts and the like. For instance, when the invented component for removing electrification is employed at a portion directly contacting electronic parts and the like of a manipulator, a vacuum chuck, a working table and the like which are employed in transmitting the electronic parts, the discharge destruction of the circuit of the electronic parts is avoided by instantly removing the electric charge electrified in the electronic parts and the like without causing a spark, which contributes to the promotion of reliability of an electronics part related manufacturing device and the promotion in the yield of the electronics parts and the like.

Further, the ceramics for removing electrification composing the component for removing electrification of this invention, is provided with high strength and wear resistance by making it dense. Therefore, the ceramics is not fractured or worn, even if it is employed in a portion which directly contacts electronic parts and the like, and there is no apprehension of contaminating the electronic parts and the like by dusts and giving out dusts in a dust free chamber.

Further, in another component for removing electrification of this invention, since the ceramics for removing electrification is a ceramics layer which is thermal-sprayed on a metal substrate, the ceramics is reinforced by the metal substrate and is hard to destruct, it is easy to manufacture a part for removing electrification having various shapes which are necessary for integrating the component into a device, since the working of the metal substrate is easy, the manufacturing cost is inexpensive, and it is easy to connect the part to the ground by employing it, since the ceramics is integrated with the metal substrate.

What is claimed is:

1. An electrification-removing component, comprising:
   a) a ceramic material for removing electrification and having a surface resistivity in a range of $2 \times 10^6$ to $10^{10}$ $\Omega/cm^2$; and
   b) an electro-conductive material connected to the ground;
   the ceramic material for removing electrification being electrically connected to the electro-conductive material with an area by contact or bonding on surfaces of the ceramic material for removing electrification, wherein the ceramic material is prepared from one or more fine powders selected from the group consisting of nitrides and carbides of Ti, Zr, Hf, Nb and Ta, in a ceramic matrix consisting essentially of alumina or silicon nitride.

2. The electrification removing component according to claim 1, wherein the area of the contacted or bonded surface is not less than 1 $mm^2$.

3. The electrification-removing component according to claim 2, wherein the area by contact or bonding is not less than 2 $mm^2$.

4. The electrification-removing component according to claim 1, wherein the ceramic material for removing electrification is a sintered body comprising one or more electro-conductive compounds selected from the group consisting of nitrides and carbides of Ti, Zr, Hf, Nb and Ta in a matrix consisting essentially of alumina, said sintered body having a relative density of not less than 90%.

5. The electrification-removing component according to claim 4, wherein the sintered body is provided by sintering a composition comprising 4 to 23 volume % of a first powder having an average particle size of not more than 5 μm of the one or more electro-conductive compounds selected from the group consisting of nitrides and carbides of Ti, Zr, Hf, Nb and Ta and the balance of a second powder having an average particle size of not more than 5 μm consisting essentially of alumina.

6. The electrification-removing component according to claim 1, wherein the ceramic material for removing electrification is a sintered body having a relative density of not less than 90%, said sintered body including silicon carbide and one or more electro-conductive compounds selected from the group consisting of nitrides of Ti, Zr, Hf, Nb and Ta in a matrix comprising $Si_3N_4$ and one or more sintering aids.

7. The electrification-removing component according to claim 6, wherein the sintered body is provided by sintering a composition comprising 0.1 to 17 wt. % of a first powder of SiC having an average particle size of not more than 5 µm, 22 to 55 weight % of a second powder having an average particle size of not more than 5 µm of one or more electro-conductive compounds selected from the group consisting of nitrides of Ti, Cr, Hf, Nb and Ta, and the balance of a third powder of $Si_3N_4$ having an average particle size of not more than 5 µm including one or more sintering aids.

8. The electrification-removing component according to claim 6, wherein the one or more sintering aids is one or more compounds selected from the group consisting of MgO, $Al_2O_3$, $AgAl_2O_4$ and $Y_2O_3$, the sintered body including 2 to 15 weight % of a total of the one or more sintering aids, and a bending strength of the sintered body being not less than 60 kg/mm².

9. The electrification-removing component according to claim 1, wherein the sintered body comprises crystal grains having an average crystal grain size of not more than 5 µm.

10. The electrification-removing component according to claim 1, wherein the ceramic material for removing electrification is a layer formed by a thermal spraying of the ceramics on a metallic under coating layer formed on a metal substrate and the thermal expansion coefficient of the under coating layer is provided with a value between those of the metal substrate and the ceramics layer.

11. The electrification-removing component according to claim 10, wherein the ceramic material layer consists essentially of (A) alumina and (B) titanium oxide, titanium nitride or combinations thereof.

12. The electrification-removing component according to claim 11, wherein the ceramic material layer includes 5 to 50 weight % of a titanium oxide or 5 to 30 weight % of a titanium nitride or both at a maximum weight percent of 50%.

13. The electrification-removing component according to claim 10, wherein the under-coating layer or the ceramic material layer or both are formed by a plasma spraying method.

14. The electrification-removing component according to claim 10, wherein the under-coating layer is constructed by a plurality of under-coating sublayers each having a different thermal expansion coefficient, the thermal expansion coefficient of an under-coating sublayer on the side of the layer of ceramic material being more proximate to the thermal expansion coefficient of the layer of ceramic material than the thermal expansion coefficient of the other under-coating sublayer on the side of the metal substrate and the total thickness of the under-coating sublayer being 30 to 50 µm.

15. The electrification-removing component according to claim 10, wherein the under-coating layer is made of a metal or a metal alloy.

16. The electrification-removing component according to claim 15, wherein the metal is selected from the group consisting of Mo, Ti, Ni, Nb, Ta and W.

17. The electrificiation-removing component according to claim 15, wherein the metal alloy is selected from the group consisting of Ni—Al, Ni—Cr, Ni—Cr—Al, Ni—Cr—Al—Y and Ni—Co—Cr—Ai—Y.

18. The electrification-removing component according to claim 1, wherein the electrification-removing component is a portion of a manipulator or a carrier handling an electronics related part.

19. The electrification-removing component according to claim 1, wherein the electro-conductive material of the electrification, removing component is electrically connected to a metal frame of a device for handling an electronics related part and the metal frame is connected to the ground.

20. The electrification-removing component according to claim 1, wherein the surface resistivity of said ceramic material is in a range of from $10^7$ to $9\times10^9$ Ω/cm².

* * * * *